(12) United States Patent
Henkel et al.

(10) Patent No.: US 10,104,762 B2
(45) Date of Patent: Oct. 16, 2018

(54) ELECTRIC ASSEMBLY TO BE MOUNTED ON A TOP-HAT RAIL

(71) Applicants: Phoenix Contact GmbH & Co. KG, Blomberg (DE); Phoenix Contact Power Supplies GmbH, Paderborn (DE)

(72) Inventors: Hartmut Henkel, Blomberg (DE); Michael Heinemann, Lage (DE); Guido Remmert, Hamm (DE)

(73) Assignees: PHOENIX CONTACT GMBH & CO. KG, Blomberg (DE); PHOENIX CONTACT POWER SUPPLIES GMBH, Paderborn (DE)

( * ) Notice: Subject to any disclaimer, the term of this patent is extended or adjusted under 35 U.S.C. 154(b) by 0 days.

(21) Appl. No.: 14/652,694

(22) PCT Filed: Nov. 18, 2013

(86) PCT No.: PCT/EP2013/074087
§ 371 (c)(1),
(2) Date: Jun. 16, 2015

(87) PCT Pub. No.: WO2014/095199
PCT Pub. Date: Jun. 26, 2014

(65) Prior Publication Data
US 2015/0342026 A1 Nov. 26, 2015

(30) Foreign Application Priority Data
Dec. 17, 2012 (DE) .................. 10 2012 112 389

(51) Int. Cl.
*H05K 1/02* (2006.01)
*H05K 7/14* (2006.01)
(Continued)

(52) U.S. Cl.
CPC ......... *H05K 1/0204* (2013.01); *H05K 1/0216* (2013.01); *H05K 1/05* (2013.01);
(Continued)

(58) Field of Classification Search
CPC .. H05K 1/0204; H05K 1/0216; H05K 7/1427; H05K 1/05; H05K 7/209;
(Continued)

(56) References Cited

U.S. PATENT DOCUMENTS

| | | | | |
|---|---|---|---|---|
| 5,403,784 | A | * | 4/1995 | Hashemi ............. H01L 21/4842 257/E23.042 |
| 5,644,327 | A | * | 7/1997 | Onyskevych ............ G09G 3/30 313/503 |

(Continued)

FOREIGN PATENT DOCUMENTS

| | | |
|---|---|---|
| DE | 41 18 198 A1 | 12/1992 |
| DE | 195 16 547 A1 | 11/1996 |

(Continued)

OTHER PUBLICATIONS

International search report, "PCT Application No. PCT/EP2013/074087", dated Apr. 8, 2014, 2 pages.

*Primary Examiner* — Mukund G Patel
(74) *Attorney, Agent, or Firm* — Mannava & Kang, P.C.; Arash Behravesh

(57) ABSTRACT

The invention relates to an electric assembly to be mounted on a top-hat rail, comprising: an electric current supply component (200): a multi-layered support (206) including a metal plate (300), a conductive layer (302) for electrically contacting the electric current supply component (200) and an electric insulation layer (304) which is arranged between the metal plate (300) and the conductive layer (302); the electric current supply component (200) is connected in an heat-conductive manner to the metal plate (300) in order to (Continued)

withdraw thermal energy from the electric current supply component (200).

11 Claims, 3 Drawing Sheets

(51) Int. Cl.
    *H05K 1/05*           (2006.01)
    *H05K 7/20*           (2006.01)
    *H05K 3/00*           (2006.01)

(52) U.S. Cl.
    CPC .......... *H05K 7/1427* (2013.01); *H05K 7/1432* (2013.01); *H05K 7/209* (2013.01); *H01L 2924/0002* (2013.01); *H05K 1/0263* (2013.01); *H05K 3/0061* (2013.01)

(58) Field of Classification Search
    CPC .. H05K 7/1432; H05K 3/0061; H05K 1/0263; H01L 2924/0002
    USPC .......................................... 361/699, 702, 710
    See application file for complete search history.

(56) References Cited

U.S. PATENT DOCUMENTS

| | | | | |
|---|---|---|---|---|
| 5,682,068 A * | 10/1997 | McLellan | ............ | H01M 2/1044 257/678 |
| 6,166,464 A | 12/2000 | Grant | | |
| 6,558,181 B2 * | 5/2003 | Chung | ................ | H05K 7/1092 439/342 |
| 6,563,710 B1 * | 5/2003 | Okuda | ............... | H05K 7/20918 361/600 |
| 6,853,559 B2 * | 2/2005 | Panella | ............ | H01L 23/49805 257/690 |
| 7,005,586 B1 * | 2/2006 | Duley | ................... | H05K 1/141 174/260 |
| 7,375,974 B2 * | 5/2008 | Kirigaya | ............. | H05K 1/0203 174/520 |
| 7,450,387 B2 * | 11/2008 | Cheng | ................... | H01L 23/367 165/185 |
| 7,521,793 B2 * | 4/2009 | Alhayek | ............. | H01L 23/3677 257/712 |
| 7,724,140 B2 * | 5/2010 | Saito | ........................ | G01S 3/14 235/385 |
| 7,808,100 B2 * | 10/2010 | Bayerer | .................. | H01L 24/06 174/261 |
| 8,198,540 B2 * | 6/2012 | Kuromitsu | .......... | H01L 23/3735 165/185 |
| 8,235,549 B2 * | 8/2012 | Gingrich, III | ......... | F21V 15/01 362/249.02 |
| 8,953,335 B2 * | 2/2015 | Abe | ........................ | H01L 23/36 165/80.2 |
| 9,104,058 B2 * | 8/2015 | Shives | ............. | G02F 1/133385 |
| 9,326,425 B2 * | 4/2016 | Suwa | .................. | H01L 23/4334 |
| 2003/0193791 A1 * | 10/2003 | Panella | ............. | H01L 23/49805 361/764 |
| 2003/0202330 A1 * | 10/2003 | Lopata | .............. | H01L 23/49805 361/760 |
| 2003/0206399 A1 | 11/2003 | Chung et al. | | |
| 2005/0121760 A1 * | 6/2005 | Nodo | .................... | H05K 1/0263 257/678 |
| 2006/0097370 A1 * | 5/2006 | Bartley | ............. | H01L 23/49838 257/678 |
| 2009/0261472 A1 | 10/2009 | Bayerer | | |
| 2013/0265808 A1 * | 10/2013 | Ishii | ....................... | H02M 1/12 363/97 |
| 2014/0085827 A1 * | 3/2014 | Brey | ................... | H01L 23/5389 361/704 |

FOREIGN PATENT DOCUMENTS

| | | | |
|---|---|---|---|
| DE | 19748530 C1 | 2/1999 | |
| DE | 19939933 | 4/2000 | |
| DE | 19859739 | 7/2000 | |
| DE | 101 48 623 A1 | 4/2003 | |
| DE | 103 35 805 A1 | 3/2005 | |
| DE | 10 2010 033 728 A1 | 5/2011 | |
| EP | 1538670 | 6/2005 | |
| GB | 2 471 497 A | 1/2011 | |
| JP | WO 2012090877 A1 * | 7/2012 | ............. H02M 1/12 |
| WO | WO 02/39799 A1 | 5/2002 | |

\* cited by examiner

ELECTRIC ASSEMBLY TO BE MOUNTED ON A TOP-HAT RAIL

PRIORITY

The present application claims priority under 35 U.S.C. § 371 to PCT Application PCT/EP2013/074087 filed on Nov. 18, 2013, which claims priority to German Patent Application No. 10 2012 112 389.6, filed on Dec. 17, 2012, the disclosures of which are hereby incorporated by reference in their entireties.

The present invention relates to an electric assembly to be mounted on a top-hat rail.

Electrical components in electrical assemblies and functional assemblies, for example power supply units, are arranged on printed circuit boards. The individual components of the electric assembly and functional assembly are mechanically fixed to said printed circuit boards and are electrically conductively connected to one another. The printed circuit boards or PCBs have phenolic resin and paper, epoxy resin and paper, or epoxy resin and glass fiber fabric as carrier material on which electrical conductor tracks, for example in the form of a copper coating with a layer thickness of a few μm, are applied. The carrier material is electrically insulating but has a limited thermal conductivity. Therefore, the thermal energy generated by the electrical components must be dissipated to the surroundings by additional heat sinks. Said additional heat sinks require an additional mounting step and take up installation space.

The problem addressed by the present invention is therefore to provide an electric assembly which is simpler to mount and takes up less installation space.

This problem is solved by the subject matter with the features as claimed in the independent claim. Advantageous embodiments are the subject matter of the dependent claims, the description and the drawings.

The present invention is based on the discovery that an electrically insulated metal plate allows omitting additional heat sinks due to the thermal conductivity of said metal plate.

According to a first aspect, the problem is solved by an electric assembly to be mounted on a top-hat rail, having:
an electrical power supply component;
a multilayer carrier comprising a metal plate, a conductor-track layer for making electrical contact with the electrical power supply component and an electrical insulation layer which is arranged between the metal plate and the conductor-track layer; wherein
the electrical power supply component is thermally conductively connected to the metal plate in order to dissipate thermal energy from the electrical power supply component.

Thus, the technical advantage is achieved that the thermal energy generated by the power supply component, for instance electrical components of a switched-mode power supply, is dissipated well owing to the good thermal conductivity of the metal plate, with the result that additional heat sinks can be dispensed with. Thus, mounting of additional heat sinks is no longer necessary and the demand on installation space for the electric assembly is reduced.

In an advantageous embodiment, the metal plate or the conductor-track layer is formed from at least one of the following materials: aluminum, copper, an aluminum-containing alloy, a copper-containing alloy. Thus, the technical advantage is achieved that the metal plate is made from materials which are easy to handle and have good thermal conductivity. This improves the cooling effect of the metal plate and also enables it to be easy to manufacture.

In an advantageous embodiment, the conductor-track layer is formed by electrical conductor tracks. Thus, the technical advantage is achieved that the power supply components, for example electrical components of a switched-mode power supply, of the electric assembly are electrically conductively connected to one another in a simple manner.

In an advantageous embodiment, the electrical insulation layer is a thermally conductive dielectric layer. Thus, the technical advantage is achieved that thermal energy generated by the power supply component, for example electrical components of a switched-mode power supply, can be dissipated to the metal plate owing to the thermally conductive dielectric layer. This further increases the cooling effect.

In an advantageous embodiment, the metal plate is provided as shield for an alternating electromagnetic field which can be emitted by the electrical power supply component. Thus, the technical advantage is achieved that the metal plate has another additional function in addition to the cooling function. In addition to cooling, it is also used for shielding alternating electromagnetic fields which are emitted by the power supply component of the electric assembly. Thus, the electric assembly can also be used in an EMC-sensitive environment.

In an advantageous embodiment, the metal plate is configured to shield alternating electromagnetic fields with a frequency of up to 30 MHz. Thus, the technical advantage is achieved that, in particular, those frequencies of alternating electromagnetic fields which occur during operation of the power supply component of the electric assembly, in particular if the electric assembly is configured as switched-mode power supply, are shielded.

In an advantageous embodiment, the metal plate expands over the whole area. Thus, the technical advantage is achieved that shielding of alternating electromagnetic fields is further improved.

In an advantageous embodiment, the metal plate is connectable to a reference potential, in particular to a ground potential. Thus, the technical advantage is achieved that the electric voltages which are induced by the alternating electromagnetic fields can be discharged, which further improves the shielding of alternating electromagnetic fields.

In an advantageous embodiment, the electrical power supply component is a switched-mode power supply. Thus, the technical advantage is achieved that an electric assembly which is in the form of a switched-mode power supply with low demand on installation space and is particularly simple to manufacture is provided, which is also suitable for use in EMC-sensitive environments owing to the shielding effect of the metal plate with respect to electromagnetic fields.

In an advantageous embodiment, the electric assembly also comprises a housing which is provided to house the multilayer carrier and the electrical power supply component, wherein a housing section of the housing is thermally conductively connected to the metal plate. Thus, the technical advantage is achieved that the electric assembly is housed in a housing in a manner protected from moisture and dust, for example, and, at the same time, thermal energy which is generated by the power supply component, for example by electrical components of a switched-mode power supply, is dissipated from the housing into the surroundings owing to the thermally conductive connection of the metal plate to the housing section, with the result that no overheating occurs inside the housing.

In an advantageous embodiment, the multilayer carrier is a copper-clad carrier. What is achieved as a result of this is the technical effect that the electric assembly is easy to manufacture when using copper-clad material and, at the same time, has particularly good thermal conductivity and hence cooling effect owing to the copper component of the copper-clad material.

According to a second aspect, the problem is solved by the use of copper-clad material as printed circuit board in an electric assembly. What is achieved as a result of this is the technical effect that thermal energy is dissipated well owing to the good thermal conductivity of copper-clad material, with the result that additional heat sinks can be dispensed with. Thus, mounting of additional heat sinks is no longer necessary and the demand on installation space for the electric assembly is reduced.

Additional features and advantages of various embodiments will be set forth, in part, in the description that follows, and will, in part, be apparent from the description, or may be learned by the practice of various embodiments. The objectives and other advantages of various embodiments will be realized and attained by means of the elements and combinations particularly pointed out in the description herein.

Further exemplary embodiments are explained with reference to the appended drawings, in which.

It is to be understood that both the foregoing general description and the following detailed description are exemplary and explanatory only, and are intended to provide an explanation of various embodiments of the present teachings.

Figure 1:
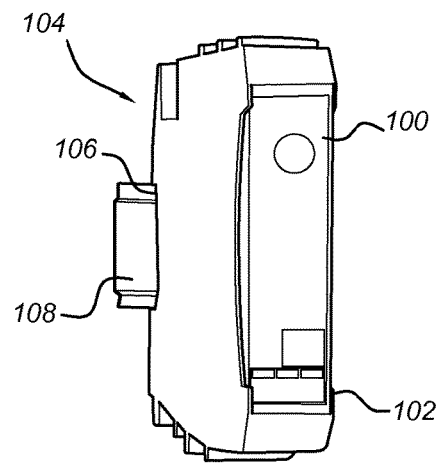
FIG. 1 shows a perspective view of an electric assembly.

FIG. 1 shows a switched-mode power supply as an exemplary embodiment of an electric assembly 100. The electric assembly 100 has a housing 102 which, in the present embodiment, has a latching device 106 on the rear 104 of said housing, with which latching device said housing is latched onto a top-hat rail 108.

Figure 2:
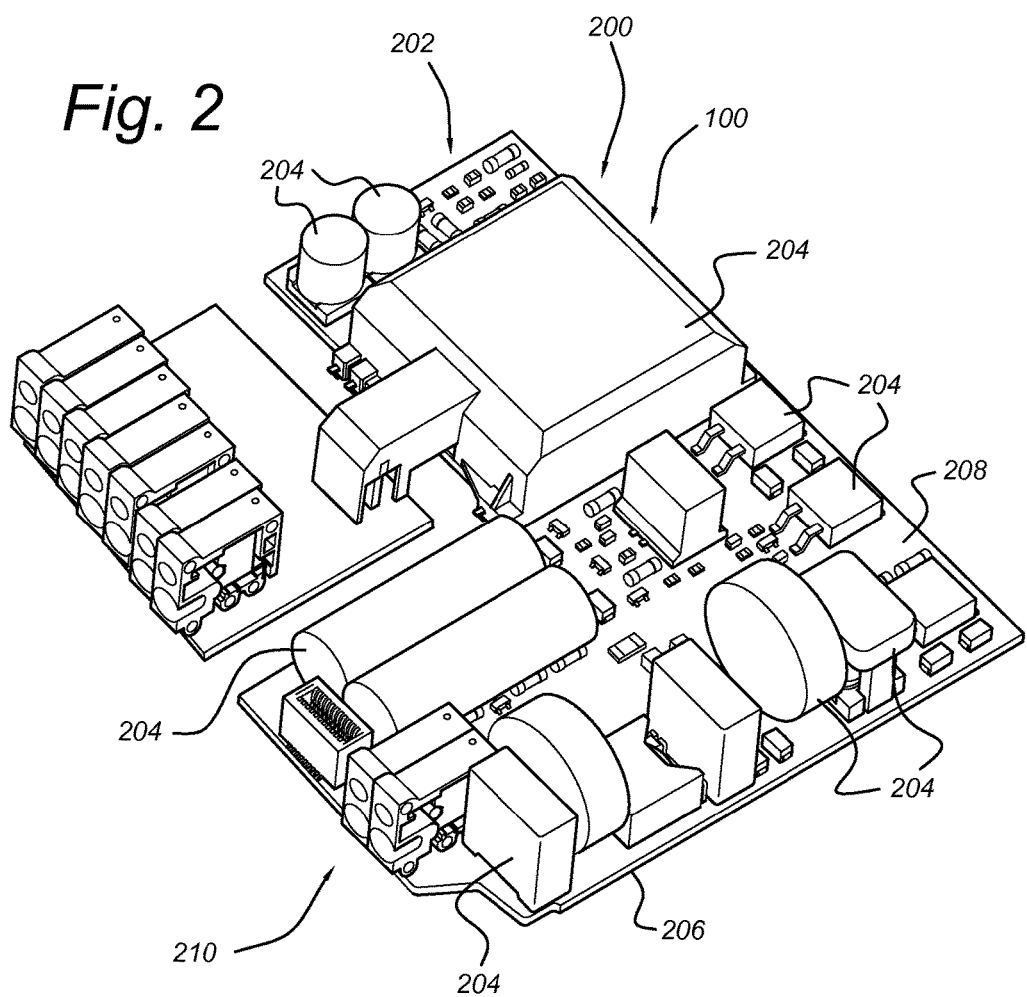
FIG. 2 shows a perspective view of a multilayer carrier with a power supply component.

FIG. 2 shows an exemplary embodiment of a power supply component 200 of the electric assembly 100. The power supply component 200 is configured as switched-mode power supply 202 in the present exemplary embodiment.

In the present exemplary embodiment, the power supply component 200 comprises a plurality of electrical components 204 which are arranged on a carrier that is a multilayer carrier 206 in the present exemplary embodiment and are appropriately interconnected. The multilayer carrier has a top 208 on which the electrical components 204 are arranged, and a bottom which is opposite the top 208 and, as explained again below, is configured as mating contact surface 210.

Figure 3:
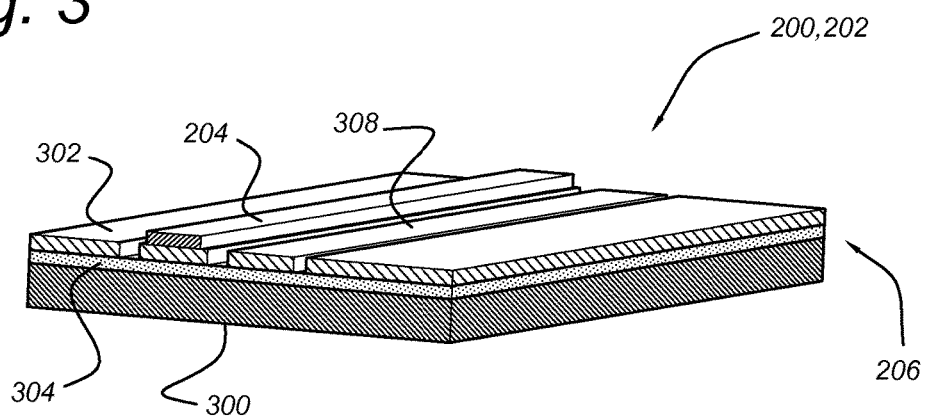
FIG. 3 shows another perspective view of a multilayer carrier with a power supply component.

FIG. 3 shows an exemplary embodiment of a multilayer carrier 206 for the switched-mode power supply 202. In the present exemplary embodiment, the multilayer carrier 206 is a copper-clad carrier.

In the present exemplary embodiment, the multilayer carrier 206 has a metal plate 300, a conductor-track layer 302 for making electrical contact with electrical components 204 of the electrical power supply component 200 or of the switched-mode power supply 202, and an electrical insulation layer 304 which is arranged between the metal plate 300 and the conductor-track layer 302.

In the present exemplary embodiment, the metal plate 300 is formed from aluminum or copper or from an alloy which contains aluminum or copper. Furthermore, in the present exemplary embodiment, the metal plate 300 shields alternating electromagnetic fields which are emitted by the electrical components 204 during operation of the switched-mode power supply 202. For this purpose, in the present exemplary embodiment, the metal plate 300 expands over the whole area, that is to say it does not have any holes or apertures which extend through its thickness. In order to enable use of the switched-mode power supply 202 also in an EMC-sensitive environment, the metal plate 300 is configured to shield alternating electromagnetic fields with a frequency of up to 30 MHz since alternating electromagnetic fields with such frequencies can occur during operation of the switched-mode power supply 202.

The conductor-track layer 302 forms conductor tracks 308 which are used to make electrical contact with electrical components 204. In the present exemplary embodiment, the conductor-track layer 302 is formed from aluminum or copper or from an alloy containing aluminum or copper.

In the present exemplary embodiment, the electrical insulation layer 304 is a thermally conductive dielectric layer. Thus, a good thermally conductive connection is made between the electrical components 204 and the metal plate 300 in order to dissipate thermal energy from the electrical power supply component 200.

Figure 4:
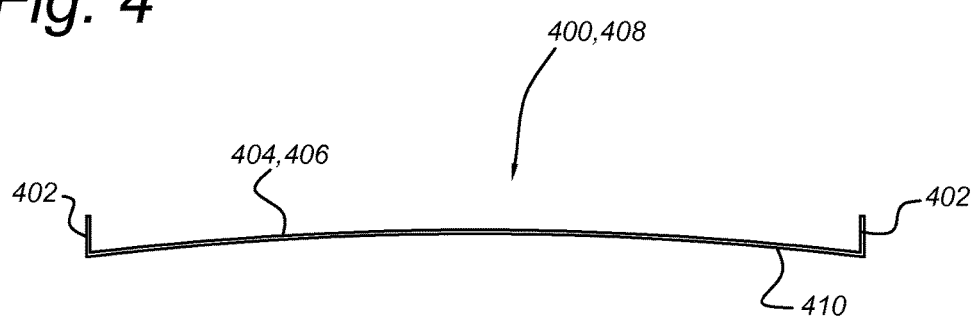
FIG. 4 shows a sectional illustration of a heat sink.

FIG. 4 shows an exemplary embodiment of a heat sink 400 for cooling the power supply component 200. In the present exemplary embodiment, the heat sink 400 is configured as housing section 410 of a housing 408 for housing the power supply component 200 and can be connected to another partial housing (not illustrated) which is configured as cover.

In the present exemplary embodiment, the heat sink 400 is manufactured, in one piece and in a materially integral manner, from fiber-reinforced plastic, wherein glass fiber, ceramics, oxides, ceramic oxides or metal oxides can also be added to the plastics material in the present exemplary embodiment in order to further increase the thermal conductivity and hence to optimize the cooling effect of the heat sink 400.

In the present exemplary embodiment, the heat sink 400 has two lateral limits 402 which, as described below, are used for the positioning of a power supply component 200. Furthermore, in the present exemplary embodiment, the heat sink 400 has a contact surface 404 which can be brought into thermally conductive contact with one of the mating contact surfaces 210 of the carrier 206 of the power supply component 200 in order for heat to be dissipated from the power supply component 200 and hence to cool said component.

In the present exemplary embodiment, the contact surface 404 is configured as elastically deformable section 406 of the heat sink 400. The elastically deformable section 406 is configured as manually deformable in the present exemplary embodiment. Thus, deformation is possible without the use of tools or machines. In the initial state, as illustrated in FIG. 4, the contact surface 404 is convexly curved. After mounting, that is to say in the mounted state, the contact surface 404 in the present exemplary embodiment is flattened, compared to the initial state, in a surface section by elastic deformation, as explained further below.

Figure 5:
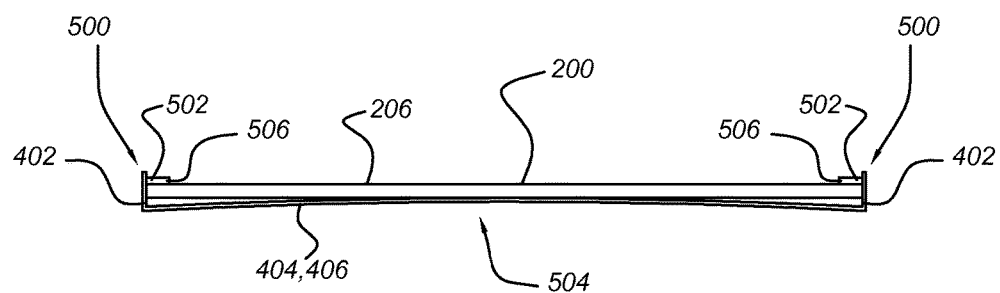
FIG. 5 shows a sectional illustration of another heat sink.

FIG. 5 shows another exemplary embodiment of a heat sink 400 for cooling the power supply component 200.

The heat sink 400 illustrated in FIG. 5 has the same design as the heat sink 400 illustrated in FIG. 4 apart from the difference that the heat sink 400 according to FIG. 5 has a receptacle 500 for the power supply component 200.

In the present exemplary embodiment, the receptacle 500 comprises support rails 502, which are integrally formed at each of the two limits 402, wherein the support rails have the same extension direction as the limits 402 in the present exemplary embodiment. The support rails 502 are manufactured from the same material as the limits 402 in the present exemplary embodiment. Thus, in the present exemplary embodiment, the heat sink 400 is manufactured in one piece and in a materially integral manner with the limits 402 and the support rails 502 from fiber-reinforced plastic to which, in the present exemplary embodiment, ceramics, oxides, ceramic oxides or metal oxides have been added in order to further increase the thermal conductivity.

FIG. 5 also shows that the heat sink 500 has been connected to the power supply component 200.

A surface section 504 of the contact surface 404 is in direct contact with the mating contact surface 210 of the carrier 206. Thus, thermal energy can be dissipated from electrical components 204 through the carrier 206 to the heat sink 400. It can also be seen that the heat sink 400 is slightly convexly curved. Thus, a surface portion 504 of the contact surface 404 which is brought into contact with the mating contact surface 210 by the mounting of the heat sink 400 is increased and thus the thermally conductive connection between the heat sink 400 and the power supply component 200 is improved. In this case, during mounting, the contact surface 404 of the heat sink 400 is pressed against the mating contact surface 210.

The two support rails 502 are in contact with edge sections 506 of the carrier 206 in the present exemplary embodiment. Thus, the support rails 502 engage around the carrier 206 in a U-shaped manner in the present exemplary embodiment. Owing to said contact of the edge sections 506 with the support rails 502, the elastic section 406 is deformed such that the elastically deformable section 406 is flattened and is in flat contact with the mating contact surface 210.

Figure 6:
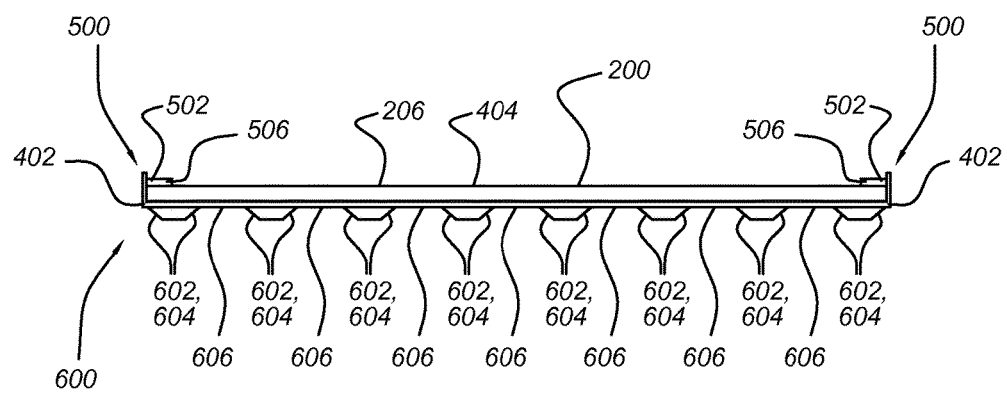
FIG. 6 shows a sectional illustration of another heat sink with an electric assembly.

FIG. 6 shows another exemplary embodiment of a heat sink 400 for cooling the power supply component 200.

The heat sink 200 illustrated in FIG. 6 has the same design as the heat sink 400 illustrated in FIG. 5 apart from the difference that the contact surface 404 is completely in contact with the mating contact surface 210 of the carrier 206, such that the heat transfer from the carrier 206 to the heat sink 400 is maximized.

Furthermore, the heat sink 400 illustrated in FIG. 6 has a rear which is configured as heat radiation surface 600. For this purpose, the heat radiation surface 600 in the present exemplary embodiment has elevations 602 which increase the surface of the heat radiation surface 600 and hence the dissipation of heat from electrical components 204 is improved. Thereby, in the present exemplary embodiment, the heat radiation surface 600 is configured to emit thermal energy in the form of IR radiation.

For this purpose, in the present exemplary embodiment, the elevations 602 are configured such that the emitted IR radiation does not encounter the heat radiation surface 600 again. In the present exemplary embodiment, the elevations 602 have phases 604 for this purpose with an angle of 45° with respect to the plane of the heat radiation surface 600 or the contact surface 404, which phases are arranged between sections 606 of the heat radiation surface 600 the planes of which are parallel to the plane of the heat radiation surface 600 or the contact surface 404. In this case, in the present exemplary embodiment, the sections 606 are arranged at different heights.

For the purpose of mounting, the heat sink 400 is deformed to the extent that the deformable section 406 of the contact surface 404 has such a low degree of convexity that the carrier 206 can be easily inserted with its edge sections 506 into the intermediate spaces between the support rails 502 and the contact surface 404. In a subsequent step, the carrier 206 is displaced until the contact surface 404 and the mating contact surface 210 of the carrier 206 completely cover one another, with the result that the contact surface 404 is completely in contact with the mating contact surface 210 of the carrier 206 and the heat transfer from the carrier 206 to the heat sink 400 is maximized. Thus, simple mounting without additional fixing means is possible.

All of the features explained and shown in connection with individual embodiments of the invention may be provided in various combinations in the subject matter according to the invention in order to simultaneously provide the advantageous effects thereof.

The scope of protection of the present invention is specified by the claims and is not restricted by the features explained in the description or shown in the figures.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications may be made without departing from the scope of the teachings herein.

LIST OF REFERENCE SIGNS 100 electric assembly
102 housing
104 rear
106 latching device
108 top-hat rail
200 power supply component
202 switched-mode power supply
204 electrical component
206 multilayer carrier
208 top
210 mating contact surface
300 metal plate
302 conductor-track layer
304 electrical insulation layer
308 conductor track
400 heat sink
402 limits
404 contact surface
406 deformable section
408 housing
410 housing section
500 receptacle
502 support rail
504 surface portion
506 edge section
600 heat radiation surface
602 elevations
604 phase
606 section

The invention claimed is:

1. An electric assembly to be mounted on a top-hat rail, comprising:

an electrical power supply component comprising:
  a plurality of electrical components arranged on a multilayer carrier;
wherein the multilayer carrier comprises:
  a top on which the electrical components are arranged;
  a bottom, opposite the top and configured as a mating surface;
  a metal plate,
  a conductor-track layer for making electrical contact with the electrical power supply component, and
  an electrical insulation layer which is arranged between the metal plate and the conductor-track layer, wherein the electrical insulation layer is a thermally conductive dielectric layer;
wherein the metal plate substantially covers the insulation layer, and
wherein the electrical power supply component is thermally conductively connected to the metal plate in order to dissipate thermal energy from the electrical power supply component;
a housing configured to house the multilayer carrier and the electrical power supply component, wherein the housing includes a housing section that acts as a heat sink and is thermally conductively connected to the metal plate; and
wherein the heatsink is (i) configured to dissipate thermal energy generated by the electrical power supply component, (ii) formed in one piece and in a materially integral manner from a polymer, (iii) has two lateral limits, which are configured to position the electrical power supply component, and (iv) has a contact surface, which is in contact with the mating surface of the multilayer carrier, wherein the contact surface is configured as an elastically deformable section of the heatsink.

2. The electric assembly of claim 1, wherein at least one of the metal plate and the conductor-track layer is formed from at least one of the following materials:
  aluminum, copper, aluminum-containing alloy, and copper-containing alloy.

3. The electric assembly of claim 1, wherein the conductor-track layer is formed by electrical conductor tracks.

4. The electric assembly of claim 1, wherein the metal plate is provided as a shield for an alternating electromagnetic field emitted by the electrical power supply component.

5. The electric assembly of claim 1, wherein the metal plate is configured to shield alternating electromagnetic fields with a frequency of up to 30 MHz.

6. The electric assembly of claim 1, wherein the metal plate expands to substantially cover an area corresponding to electrical components of the electrical power supply component.

7. The electric assembly of claim 1, wherein the metal plate is connectable to a reference potential.

8. The electric assembly of claim 1, wherein the electrical power supply component is a switched-mode power supply.

9. The electric assembly of claim 1, wherein the metal plate expands to substantially cover an area corresponding to at least a switched-mode power supply.

10. The electrical assembly of claim 1, wherein the metal plate is connectable to a ground potential.

11. An electric assembly to be mounted on a top-hat rail comprising:
  an electrical power supply component comprising:
    a plurality of electrical components arranged on a multilayer carrier;
  wherein the multilayer carrier comprises:
    a top on which the electrical components are arranged;
    a bottom, opposite the top and configured as a mating surface;
    a metal plate;
  a conductor-track layer for making electrical contact with the electrical power supply component;
  a housing which is provided to house the multilayer carrier and the electrical power supply component, wherein the housing includes a housing section that that acts as a heat sink and is thermally conductively connected to the metal plate;
  an electrical insulation layer which is arranged between the metal plate and the conductor-track layer, wherein the electrical insulation layer is a thermally conductive dielectric layer; and
  wherein the heatsink is (i) configured to dissipate thermal energy generated by the electrical power supply component, (ii) formed in one piece and in a materially integral manner from a polymer, (iii) has two lateral limits, which are configured to position the electrical power supply component, and (iv) has a contact surface, which is in contact with the mating surface of the multilayer carrier,
  wherein the contact surface is configured as an elastically deformable section of the heat sink;
  wherein the metal plate substantially covers the insulation layer; and
  wherein the electrical power supply component is thermally conductively connected to the metal plate in order to dissipate thermal energy from the electrical power supply component.

* * * * *